US009809450B2

(12) United States Patent
Shin et al.

(10) Patent No.: US 9,809,450 B2
(45) Date of Patent: Nov. 7, 2017

(54) CMOS-MEMS INTEGRATION USING METAL SILICIDE FORMATION

(71) Applicant: InvenSense, Inc., San Jose, CA (US)

(72) Inventors: Jong Il Shin, San Jose, CA (US); Peter Smeys, San Jose, CA (US); Jongwoo Shin, Pleasanton, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/838,237

(22) Filed: Aug. 27, 2015

(65) Prior Publication Data

US 2017/0057813 A1    Mar. 2, 2017

(51) Int. Cl.
*B81C 1/00* (2006.01)
*B81B 7/00* (2006.01)

(52) U.S. Cl.
CPC ........ *B81C 1/00238* (2013.01); *B81B 7/0006* (2013.01); *B81B 2207/012* (2013.01); *B81C 2203/019* (2013.01); *B81C 2203/036* (2013.01); *B81C 2203/0792* (2013.01)

(58) Field of Classification Search
CPC .............. B81C 1/00238; B81C 7/0006; B81C 2203/019; B81C 2203/036; B81B 2207/012
See application file for complete search history.

(56) References Cited

U.S. PATENT DOCUMENTS

| 8,564,076 B1* | 10/2013 | Huang .................. B81B 7/0064 257/414 |
| 9,067,779 B1* | 6/2015 | Rothberg ............ B81C 1/00238 |
| 2002/0125582 A1* | 9/2002 | Mastromatteo ..... B81C 1/00238 257/778 |
| 2011/0049652 A1 | 3/2011 | Wu et al. |
| 2015/0129991 A1 | 5/2015 | Lee et al. |

FOREIGN PATENT DOCUMENTS

EP    1219565 A1    7/2002

OTHER PUBLICATIONS

Extended European Search Report for Appln No. 16185401.3 dated Nov. 3, 2016 (6 pages).

* cited by examiner

*Primary Examiner* — Whitney T Moore
(74) *Attorney, Agent, or Firm* — Amin, Turocy & Watson, LLP

(57) ABSTRACT

A method and system for forming a MEMS device are disclosed. In a first aspect, the method comprises providing a conductive material over at least a portion of a top metal layer of a base substrate, patterning the conductive material and the at least a portion of the top metal layer, and bonding the conductive material with a device layer of a MEMS substrate via metal silicide formation. In a second aspect, the MEMS device comprises a MEMS substrate, wherein the MEMS substrate includes a handle layer, a device layer, and an insulating layer in between. The MEMS device further comprises a base substrate, wherein the base substrate includes a top metal layer and a conductive material over at least a portion of the top metal layer, wherein the conductive material is bonded with the device layer via metal silicide formation.

19 Claims, 5 Drawing Sheets

CMOS-MEMS INTEGRATION USING METAL SILICIDE FORMATION

FIELD OF THE INVENTION

The present invention relates to microelectromechanical systems (MEMS) devices, and more particularly, to a complementary metal-oxide-semiconductor (CMOS)-MEMS integration using metal silicide formation.

BACKGROUND

Microelectromechanical systems (MEMS) devices are produced using various bonding techniques. Conventional bonding occurs at high temperatures and high down forces which cause thermo-mechanical stress to the MEMS devices thereby rendering the MEMS devices with a parametric shift, or non-functional in the worst case. Therefore, there is a strong need for a solution that overcomes the aforementioned issues. The present invention addresses such a need.

SUMMARY OF THE INVENTION

A method and system for forming a MEMS device are disclosed. In a first aspect, the method comprises providing a conductive material over at least a portion of a top metal layer of a base substrate, patterning the conductive material and the at least a portion of the top metal layer, and bonding the conductive material with a device layer of a MEMS substrate via metal silicide formation.

In a second aspect, the MEMS device comprises a MEMS substrate, wherein the MEMS substrate includes a handle layer, a device layer, and an insulating layer in between. The MEMS device further comprises a base substrate, wherein the base substrate includes a top metal layer and a conductive material over at least a portion of the top metal layer, wherein the conductive material is bonded with the device layer via metal silicide formation.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

Figure 1A:
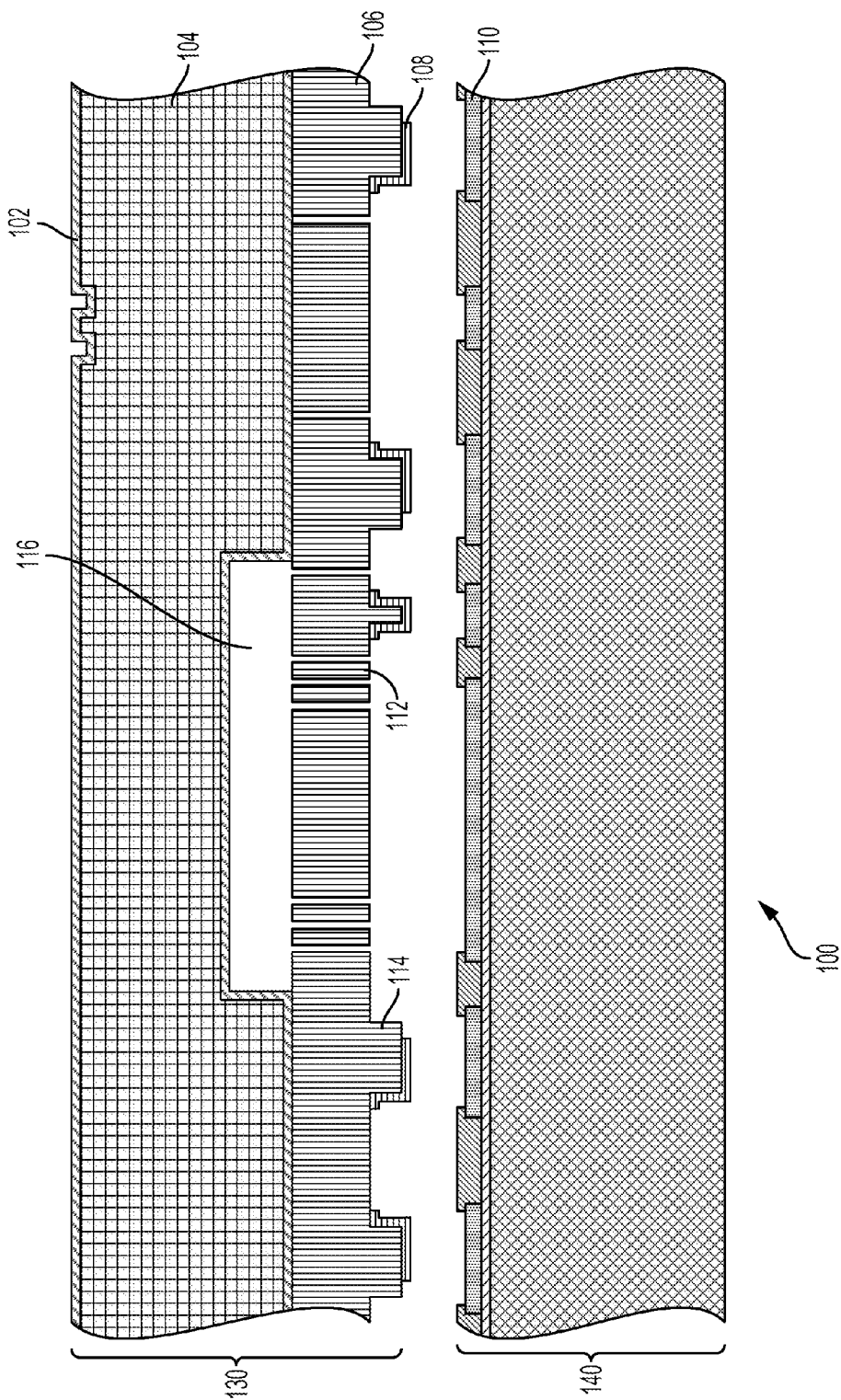
FIG. 1A illustrates a CMOS-MEMS integrated device before Al—Ge eutectic bonding in accordance with an embodiment.

The present invention relates to microelectromechanical systems (MEMS) devices, and more particularly, to a complementary metal-oxide-semiconductor (CMOS)-MEMS integration using metal silicide formation. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Micro-Electro-Mechanical Systems (MEMS) refers to a class of devices fabricated using semiconductor-like processes and exhibiting mechanical characteristics such as the ability to move or deform. MEMS often, but not always, interact with electrical signals. A MEMS device may refer to a semiconductor device implemented as a microelectromechanical system. A MEMS device includes mechanical elements and optionally includes electronics for sensing. MEMS devices include but are not limited to gyroscopes, accelerometers, magnetometers, and pressure sensors.

In MEMS devices, a port is an opening through a substrate to expose MEMS structure to the surrounding environment. A chip includes at least one substrate typically formed from a semiconductor material. A single chip may be formed from multiple substrates, wherein the substrates are mechanically bonded to preserve functionality. Multiple chips include at least two substrates, wherein the at least two substrates are electrically connected but do not require mechanical bonding.

Typically, multiple chips are formed by dicing wafers. MEMS wafers are silicon wafers that contain MEMS structures. MEMS structures may refer to any feature that may be part of a larger MEMS device. One or more MEMS features comprising moveable elements is a MEMS structure. MEMS features may refer to elements formed by a MEMS fabrication process such as bump stop, damping hole, via, port, plate, proof mass, standoff, spring, and seal ring.

A MEMS handle layer provides mechanical support for a MEMS device layer. In some embodiments, the handle layer serves as a cap to the MEMS structure. Bonding may refer to methods of attaching and the MEMS substrate and an integrated circuit (IC) substrate may be bonded using a eutectic bond (e.g., AlGe, CuSn, AuSi), fusion bond, compression, thermocompression, adhesive bond (e.g., glue, solder, anodic bonding, glass frit). An IC substrate may refer to a silicon substrate with electrical circuits, typically CMOS circuits. A package provides electrical connection between bond pads on the chip to a metal lead that can be soldered to a printed board circuit (PCB). A package typically comprises a substrate and a cover.

Complementary metal-oxide-semiconductor (CMOS)-MEMS integrated devices include a CMOS-MEMS backend process that may require photolithography and patterning on the ground surface of the CMOS or the MEMS wafers/substrates that make up the CMOS-MEMS integrated device. A CMOS-MEMS backend process covers all remaining steps after the bonding of the CMOS and the MEMS wafers to each other.

Conventionally bonding germanium (Ge) to aluminum (Al) between a CMOS substrate and a MEMS substrate (to formulate a MEMS device) creates a robust electrical and mechanical contact. However, an eutectic reaction occurs above 420 degrees Celsius which requires high down forces (above 30 kN) to break-through the native oxide and promote intermixing between the Al and the Ge. Therefore, the aluminum-germanium (Al—Ge) eutectic bonding processes require high temperatures and high down forces.

Typically, the Al—Ge eutectic bonding process requires high temperatures that are higher than 420 degrees Celsius and high down forces that are greater than or equal to 30 kilonewtons (kN) resulting in thermal and physical stress to the MEMS device. Specifically, the high temperature and high down forces applied on the wafer during the Al—Ge eutectic bonding causes thermos-mechanical stresses to the MEMS device resulting in high wafer bow propagation (>100 microns um). In addition, high bonding temperatures promote outgassing within the cavity following Al—Ge eutectic reactions leading to an elevation of the cavity pressure.

Comparatively, low temperature CMOS-MEMS bonding processes at relatively lower temperatures (less than 400 degrees Celsius) can reduce thermo-mechanical stress to the MEMS device and outgassing within a cavity for better cavity pressure controllability. A method and system in accordance with the present invention provides for a lower temperature bonding process of the MEMS device using metal silicide formation to reduce the aforementioned issues and damage to the MEMS device that result from high temperature bonding.

In one embodiment, the bonding occurs at a lower temperature (e.g., at or below 400 degrees Celsius) and at a lower down force (e.g., at or below 20 kN) by relying on the metal silicide formation thereby reducing wafer bow and stress. In addition, using metal silicide formation reduces the outgassing amount trapped within the cavity of the MEMS device resulting in a lower cavity pressure that is closer to the pressure originally resulting from the lower temperature bonding process (so the cavity pressure is relatively closer to the actual bonding pressure during processing) when compared with the Al—Ge bonding process pressure (so the cavity pressure after eutectic bonding is higher than the Al—Ge bonding pressure during processing due to outgassing at high temperature upon completion of sealing).

While utilizing an Al-squish process, which requires a large clearance distance to avoid impact on the MEMS device, is common after Al—Ge eutectic bonding, relying on metal silicide formation is a squish free process based on a rigid conductive (metal) surface. Therefore, the sensing area of the MEMS silicone (Si) to sense electrode distances is consistent over this integration process.

To describe the features of the present invention in more detail, refer now to the following description in conjunction with the accompanying Figures.

FIG. 1A illustrates a CMOS-MEMS integrated device 100 before Al—Ge eutectic bonding in accordance with an embodiment. The CMOS-MEMS integrated device 100 includes a MEMS substrate 130 and a CMOS substrate 140. The CMOS substrate 140 includes a plurality of open bond pads of a top metal layer 110 exposed on a top surface of the CMOS substrate 140. In one embodiment, the top metal layer 110 comprises aluminum (Al). In another embodiment, the top metal layer 110 comprises any of an aluminum/copper alloy, tungsten, titanium, titanium nitride, and aluminum.

The MEMS substrate 130 includes a fusion bond oxide layer 102 on a top side and a bottom side of a MEMS handle wafer 104 that includes an upper cavity (UCAV) 116, a MEMS device 106 (made from Silicon Si) coupled to the MEMS handle wafer 104, and a Ge pad layer 108 coupled to the MEMS device 106. The MEMS substrate 130 also includes at least one actuator trench 112 patterned within the MEMS device 106 and at least one MEMS bond anchor (standoff) 114. In one embodiment, the at least one actuator trench 112 is patterned using deep reactive-ion etching (DRIE).

Figure 1B:
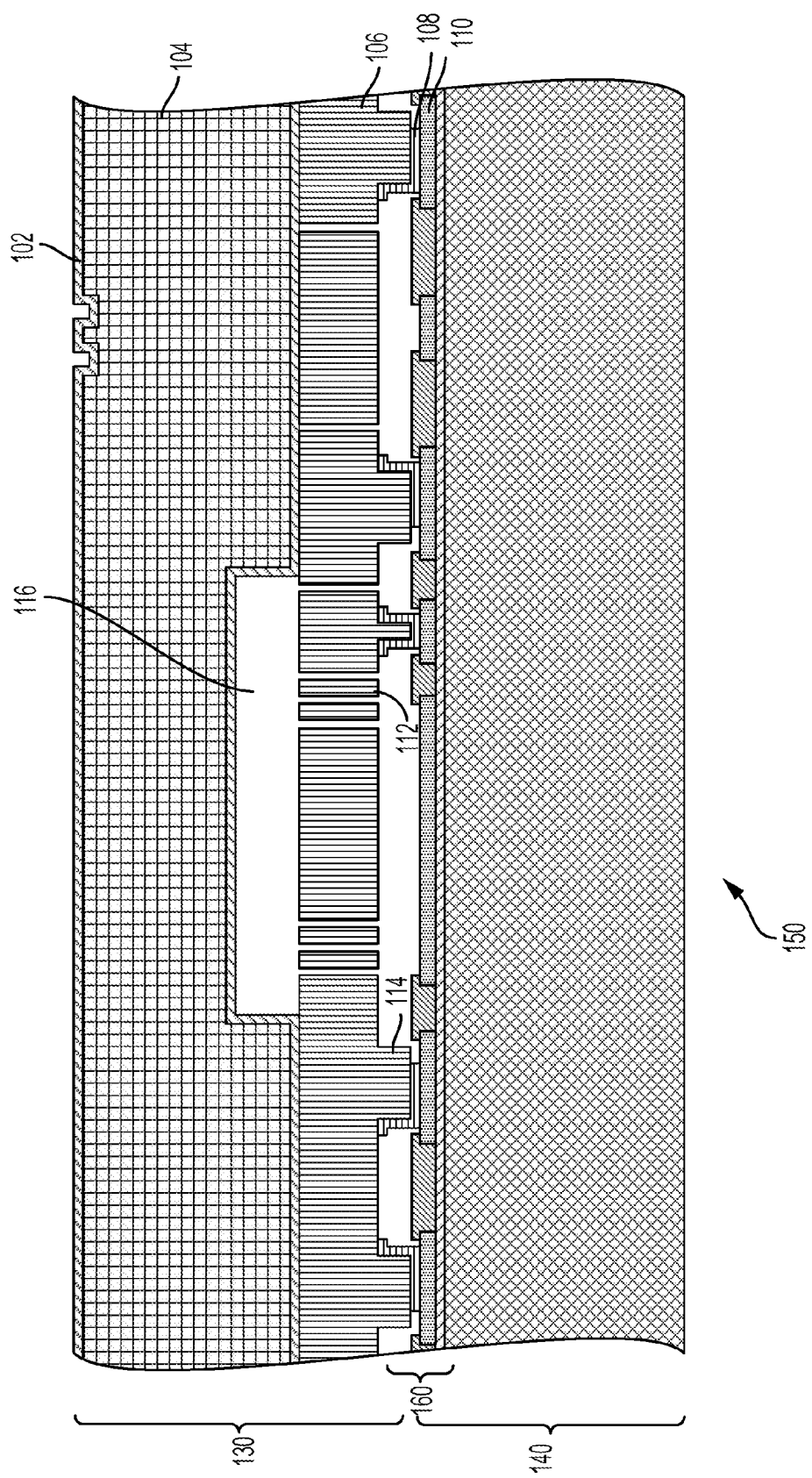
FIG. 1B illustrates the CMOS-MEMS integrated device after Al—Ge eutectic bonding in accordance with an embodiment.

FIG. 1B illustrates the CMOS-MEMS integrated device 150 after Al—Ge eutectic bonding in accordance with an embodiment. The CMOS-MEMS integrated device 150 includes the same components 102-116, 130, and 140 as the CMOS-MEMS integrated device 100. The bonding occurs across a bonding region 160 that couples/bonds the at least one MEMS bond anchor (standoff) 114 of the MEMS substrate 130 to the bond pads of the top metal layer 110 of the CMOS substrate 140 via the Ge pad layer 108.

Figure 2:
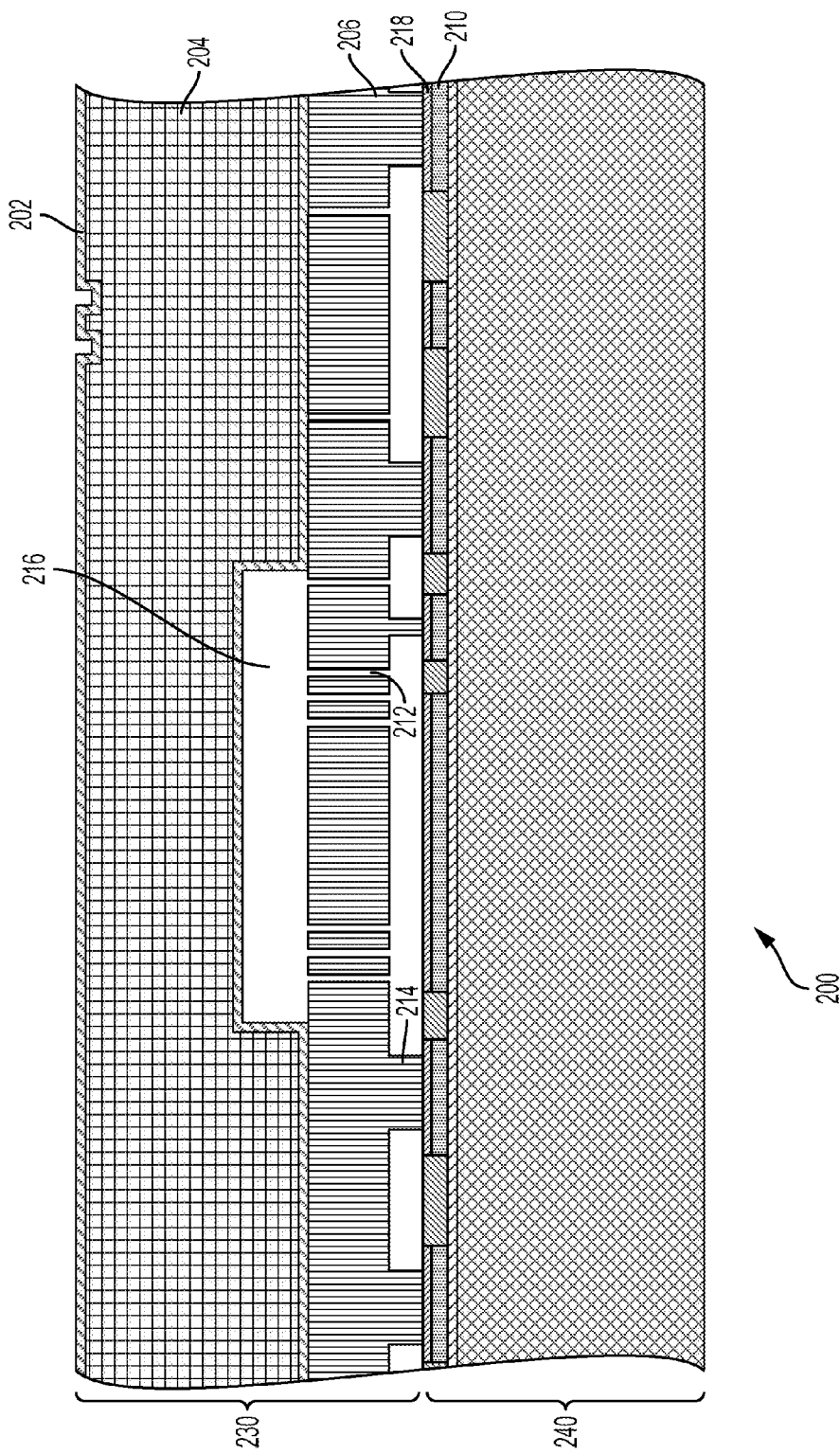
FIG. 2 illustrates a CMOS-MEMS integrated device using a lower temperature bonding process in accordance with a first embodiment.

FIG. 2 illustrates a CMOS-MEMS integrated device 200 using a lower temperature bonding process in accordance with a first embodiment. The CMOS-MEMS integrated device 200 includes a MEMS substrate 230 and a CMOS substrate 240. The CMOS substrate 240 includes a plurality of open bond pads that comprise a top metal layer 210 exposed on a top surface of the CMOS substrate 240. In one embodiment, the top metal layer 210 comprises aluminum (Al). In another embodiment, the top metal layer 210 comprises any of an aluminum/copper alloy, tungsten, titanium, titanium nitride, and aluminum.

In addition, and unlike the CMOS-MEMS integrated devices 100 and 150, the CMOS-MEMS integrated device 200 includes a conductive metal layer 218 that is deposited on top of the top metal layer 210. The combination of the top metal layer 210 and the conductive metal layer 218 is patterned to form a new top metal layer. In one embodiment, the conductive metal layer 218 that is deposited is between 10 and 500 nanometers (nm) in thickness. In one embodiment, the conductive metal layer 218 is made from any of titanium (Ti), nickel (Ni), cobalt (Co), and any combination thereof. The new top metal layer serves as the bond pad that is coupled to the MEMS substrate 230. In this embodiment, the new top metal layer also serves as an electrode layer.

As in FIG. 1A, the MEMS substrate 230 of FIG. 2 includes a fusion bond oxide layer 202 on a top side and a bottom side of a MEMS handle wafer 204 that includes an upper cavity (UCAV) 216, a MEMS device 206 (made from Silicon Si) coupled to the MEMS handle wafer 204. However, the MEMS substrate 230 does not include a Ge pad layer coupled to the MEMS device 206. The MEMS substrate 230 also includes at least one actuator trench 212 patterned within the MEMS device 206 and at least one MEMS bond anchor (standoff) 214.

In one embodiment, the at least one actuator trench 212 is patterned using deep reactive-ion etching (DRIE). The at least one MEMS bond anchor (standoff) 214 is coupled to the new top metal layer via the conductive metal layer 218. The bonding of the at least one MEMS bond anchor (standoff) 214 to the bond pads of the conductive metal layer 218 uses metal silicide formation that relies on low down forces (<=20 kN) and a lower temperature (<=400C).

Figure 3:
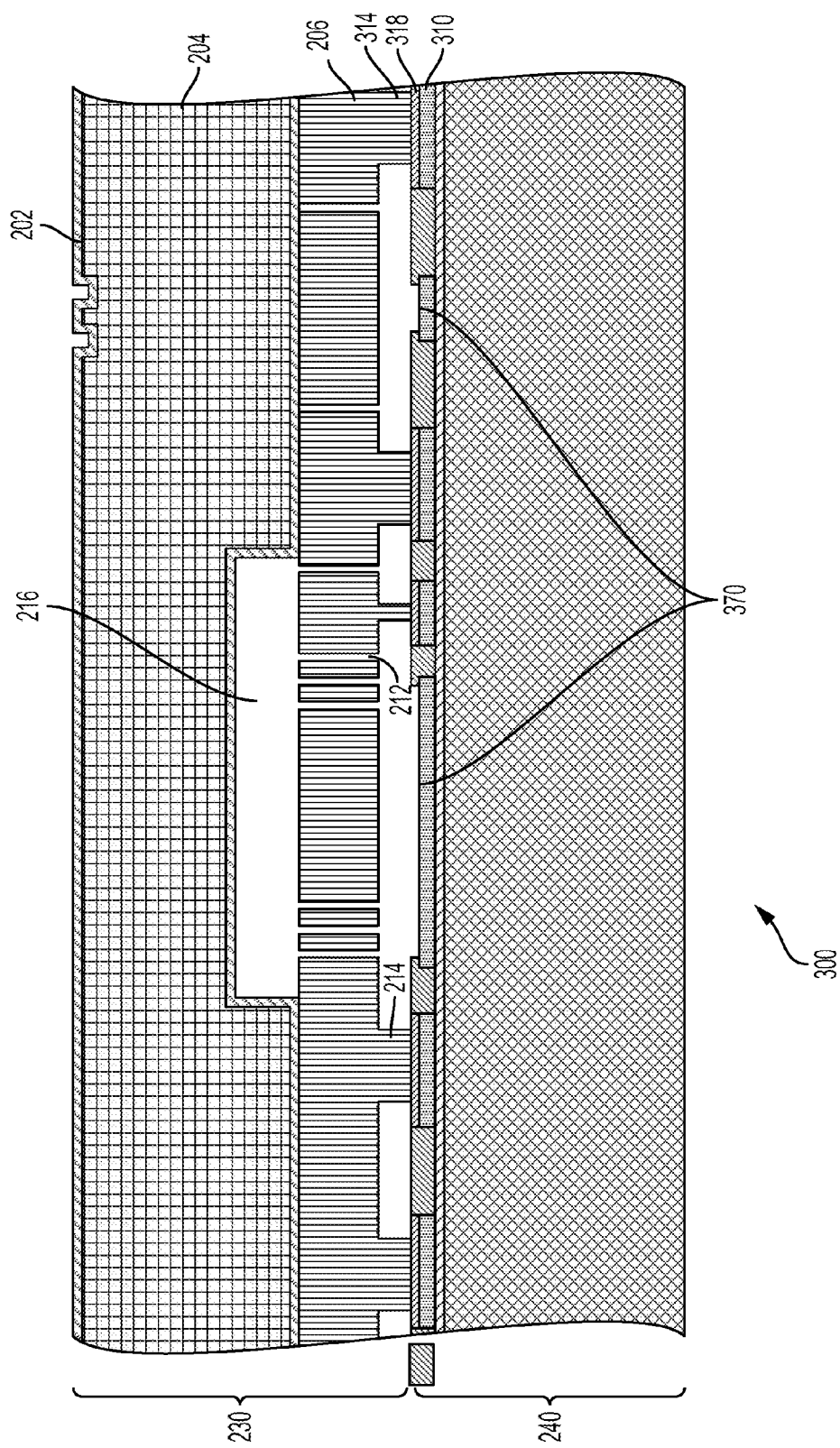
FIG. 3 illustrates a CMOS-MEMS integrated device using a lower temperature bonding process in accordance with a second embodiment.

FIG. 3 illustrates a CMOS-MEMS integrated device 300 using a lower temperature bonding process in accordance with a second embodiment. The CMOS-MEMS integrated device 300 includes the same components 202-216, 230, and 240 as the CMOS-MEMS integrated device 200 of FIG. 2. However, in FIG. 3, the conductive metal layer 318 is present over the areas in which bonding with the at least one MEMS bond anchor (standoff) 314 occurs using a masking process. Therefore, there is no conductive metal layer 318 over the area 370. Specifically, the conductive metal layer 318 is selectively patterned only on eutectic bond pads formed on the top metal layer 310 thereby leaving electrodes, shields, and wire bond pads (that make up the area 370) open which exposes the top metal layer 310.

Figure 4:
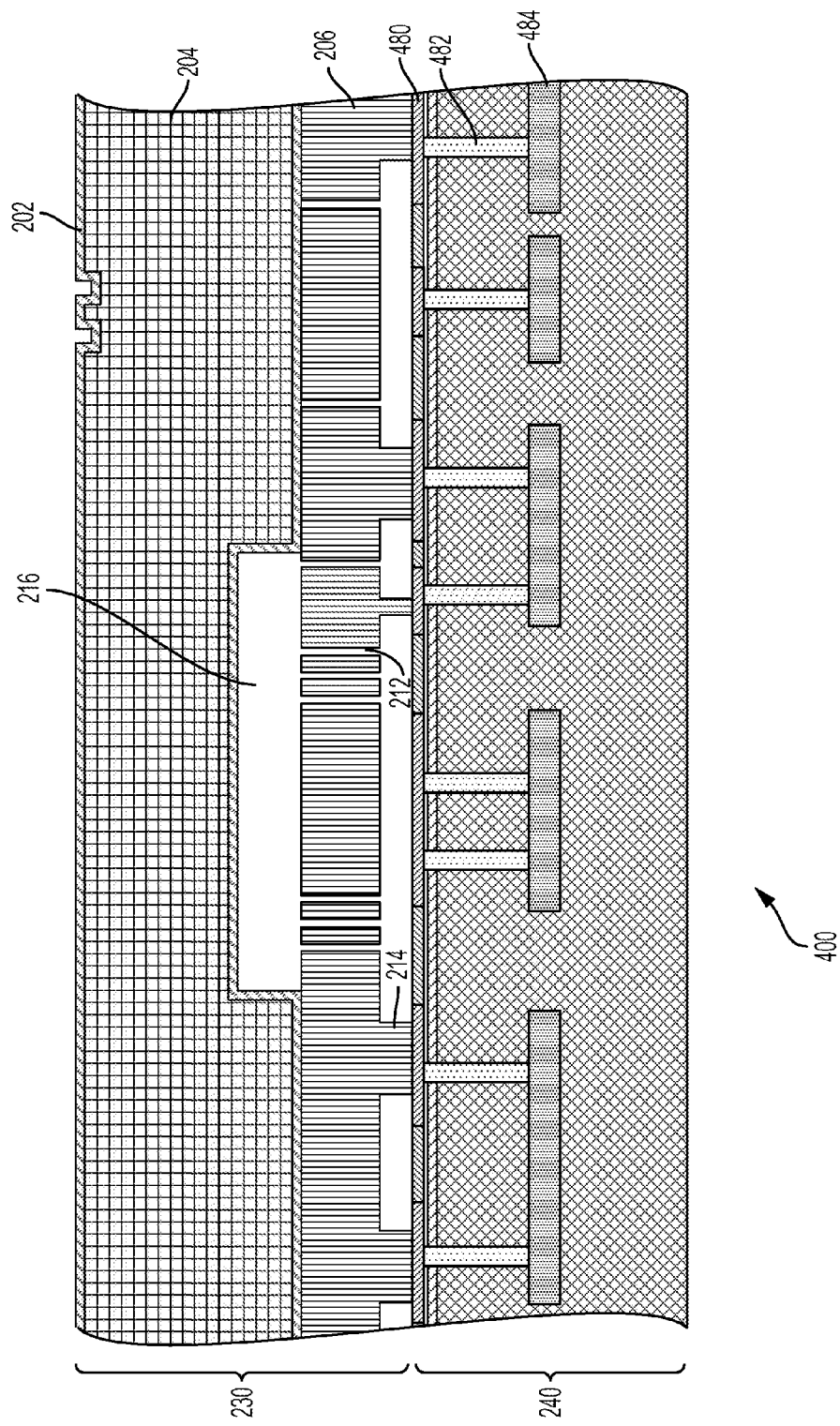
FIG. 4 illustrates a CMOS-MEMS integrated device using a lower temperature bonding process in accordance with a third embodiment.

FIG. 4 illustrates a CMOS-MEMS integrated device 400 using a lower temperature bonding process in accordance with a third embodiment. The CMOS-MEMS integrated device 400 includes the same components 202, 204, 206, 212, 214, and 216 of the MEMS substrate 230 of FIG. 2. However, in FIG. 4, the CMOS substrate includes a layer 480 instead of the new top metal layer of FIG. 2 that is formed as a combination between the top metal layer 210 and the conductive metal layer 218. The layer 480 is coupled to at least one via 482 that interconnects to a buried CMOS metal layer 484. In one embodiment, the layer 480 serves as at least one electrode and at least one bond pad using any of a copper (Cu) and a tungsten (W) metal.

As in FIG. 2, the lower temperature bonding process of FIG. 4 that utilizes a metal silicide formation enables the removal of the Al-squish process utilized by conventional bonding processes. Without Al-squish, the MEMS Si to M-top sensing electrode gap is just the standoff heights. Therefore, less clearance distance is required between the bond anchor and other moveable masses due to the removal of Al-squish.

In one embodiment, a method for forming a MEMS device is disclosed. The MEMS device includes a MEMS substrate and a base substrate, wherein the base substrate comprises a CMOS substrate that includes a top metal layer and the MEMS substrate includes a handle layer, a device layer, and an insulating layer in between. In one embodiment, the insulating layer is thin (nanometers in thickness) and in another embodiment, the insulating layer is thick (over 500 nm or in microns in thickness).

The method comprises providing a conductive material over at least a portion of the top metal layer, patterning the conductive material and the at least a portion of the top metal layer, and bonding the conductive material with the device layer via metal silicide formation. In one embodiment, the method further comprises providing an actuator in the device layer before the bonding step and the actuator is provided using DRIE as well.

In one embodiment, the providing step comprises providing the conductive material only on one or more bond pads formed on the top metal layer and the bonding step comprises bonding the one or more bond pads of the top metal layer to the device layer via the metal silicide formation. In this embodiment, the bonding step utilizes a low temperature bond that comprises a bond at 400 degrees Celsius or lower. In another embodiment, the low temperature bond is at 420 degrees C. or lower. The bonding step provides both an electrical connection and a hermetic seal.

In one embodiment, the conductive material comprises any of titanium, cobalt, and nickel and is provided using a deposition process that deposits a very thin layer (~5-500 nm). In one embodiment, the top metal layer comprises any of aluminum/copper, tungsten, titanium, titanium nitride, and aluminum.

A method for forming a MEMS device is provided. The MEMS device includes a MEMS substrate and a base substrate, wherein the base substrate includes a top metal layer and the MEMS substrate includes a handle layer, a device layer, and an insulating layer in between, the method comprises: providing a conductive material over at least a portion of the top metal layer; patterning the conductive material and the at least a portion of the top metal layer; and bonding the conductive material with the device layer via metal silicide formation, wherein the metal silicide formation is amorphous. In one embodiment, MEM device comprises: a MEMS substrate, wherein the MEMS substrate includes a handle layer, a device layer, and an insulating layer in between; and a base substrate, wherein the base substrate includes a top metal layer and a conductive material over at least a portion of the top metal layer, wherein the conductive material is bonded with the device layer. The bond between the conductive material and the device layer includes a metal silicide formation. The metal silicide formation is amorphous. In one embodiment, a MEMS device is disclosed that comprises a MEMS substrate, wherein the MEMS substrate includes a handle layer, a device layer, and an insulating layer in between and a base substrate, wherein the base substrate includes a top metal layer and a conductive material over at least a portion of the top metal layer, wherein the conductive material is bonded with the device layer. The bond between the conductive material and the device layer includes a metal silicide formation. In one embodiment, both the conductive material and the at least a portion of the top metal layer are patterned.

In one embodiment, the conductive layer is only provided on one or more bond pads formed on the top metal layer. The one or more bond pads of the top metal layer are bonded to the device layer via the metal silicide formation to provide an electrical connection and a hermetic seal. Specifically, the bond provides an electrical connection between the device layer and the top metal layer. The bond also provides a hermetic seal.

As above described, a method and system in accordance with the present invention provides for bonding a CMOS substrate and a MEMS substrate together via a lower temperature bonding process that utilizes metal silicide formation to create a CMOS-MEMS integrated device that includes a MEMS device. Instead of using a Al—Ge eutectic bonding process that requires a higher temperature and can damage the MEMS device, the lower temperature bonding process mitigates the potential damage that occurs to the MEMS device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for forming a MEMS device, wherein the MEMS device includes a MEMS substrate and a base substrate, wherein the base substrate includes a top metal layer and the MEMS substrate includes a handle layer, a device layer, and an insulating layer in between, the method comprising:
   providing a conductive material over at least a portion of the top metal layer;
   patterning the conductive material and the at least a portion of the top metal layer; and
   bonding the conductive material with the device layer via metal silicide formation,
wherein the metal silicide formation is amorphous.

2. The method of claim 1, further comprising:
   providing an actuator in the device layer before the bonding step.

3. The method of claim 1, wherein the providing step comprises providing the conductive material only on one or more bond pads formed on the top metal layer.

4. The method of claim 3, wherein the bonding step comprises bonding the one or more bond pads of the top metal layer to the device layer via the metal silicide formation.

5. The method of claim 1, wherein the bonding step utilizes a low temperature bond.

6. The method of claim 5, wherein the low temperature bond comprises a bond at 400 degrees C. or lower.

7. The method of claim 1, wherein the bonding step provides both an electrical connection and a hermetic seal.

8. The method of claim 1, wherein the conductive material comprises any of titanium, cobalt, and nickel.

9. The method of claim 1, wherein the top metal layer comprises any of aluminum/copper, tungsten, titanium, titanium nitride, and aluminum.

10. The method of claim 1, wherein the base substrate comprises a CMOS substrate.

11. A MEMS device comprising:
a MEMS substrate, wherein the MEMS substrate includes a handle layer, a device layer, and an insulating layer in between; and
a base substrate, wherein the base substrate includes a top metal layer and a conductive material over at least a portion of the top metal layer, wherein the conductive material is bonded with the device layer, wherein the bond between the conductive material and the device layer includes a metal silicide formation, and wherein the metal silicide formation is amorphous.

12. The MEMS device of claim 11, wherein the conductive material and the at least a portion of the top metal layer are patterned.

13. The MEMS device of claim 11, further comprising:
an actuator within the device layer.

14. The MEMS device of claim 11, wherein the conductive material comprises any of titanium, cobalt, and nickel.

15. The MEMS device of claim 11, wherein the top metal layer comprises any of aluminum/copper, tungsten, titanium, titanium nitride, and aluminum.

16. The MEMS device of 11, wherein the conductive material is provided only on one or more bond pads formed on the top metal layer.

17. The MEMS device of claim 11, wherein the bond provides an electrical connection between the device layer and the top metal layer.

18. The MEMS device of claim 11, wherein the bond provides a hermetic seal.

19. The MEMS device of 11, wherein the base substrate comprises a CMOS substrate.

* * * * *